United States Patent [19]

Rust

[11] Patent Number: 5,880,688
[45] Date of Patent: Mar. 9, 1999

[54] ARITHMETIC CODING CONTEXT MODEL THAT ADAPTS TO THE AMOUNT OF DATA

[75] Inventor: Robert A. Rust, Boise, Id.

[73] Assignee: Hewlett-Packard Company, Palo Alto, Calif.

[21] Appl. No.: 832,681

[22] Filed: Apr. 9, 1997

[51] Int. Cl.$^6$ ..................................................... H03M 7/00
[52] U.S. Cl. ............................................ 341/107; 341/50
[58] Field of Search ............................... 341/51, 50, 107, 341/106, 60, 63

[56] References Cited

U.S. PATENT DOCUMENTS

| 5,045,852 | 9/1991 | Mitchell et al. | 341/51 |
| 5,710,562 | 1/1998 | Gormish et al. | 341/107 |
| 5,717,394 | 2/1998 | Schwartz et al. | 341/51 |

*Primary Examiner*—Marc S. Hoff
*Assistant Examiner*—Peguy JeanPierre
*Attorney, Agent, or Firm*—Anthony J Baca

[57] ABSTRACT

The present invention provides improved compression ratios for small data sets with only a minor impact of the compression ration of larger data sets by selecting a context model optimized for the size of the data set being processed. The size of the original data is determined. Based on the size, a context model is selected. The original data is compressed into the compressed data using the context model. Any number of context models may be defined and appropriate values chosen. To decompress, it is necessary to select a context model based on the size of the original data. Two ways of detecting the correct context model are described. First, the size of the original data is part of the compressed data. Alternatively, an indicator, identifying which context model was used to compress the original data, is part the compressed data.

9 Claims, 4 Drawing Sheets

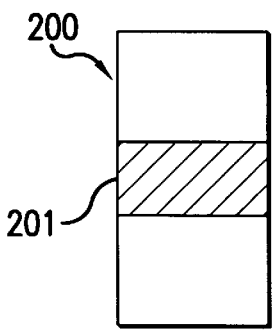 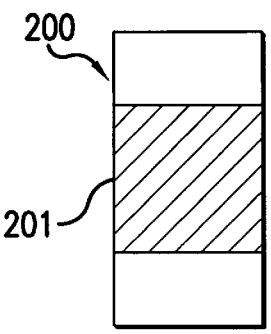 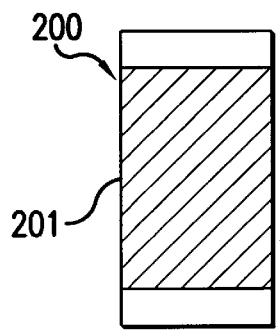 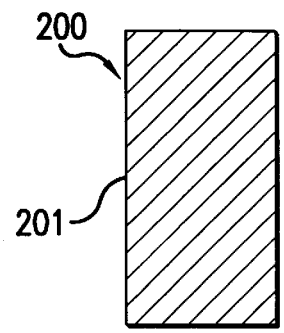
FIG. 2a       FIG. 2b       FIG. 2c       FIG. 2d
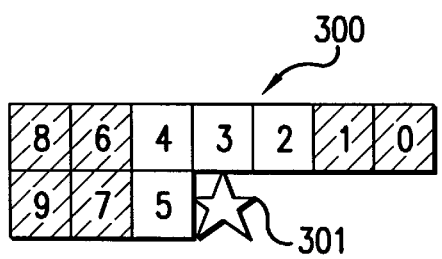 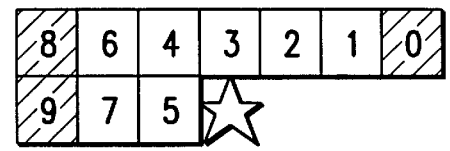
FIG. 3a       FIG. 3b
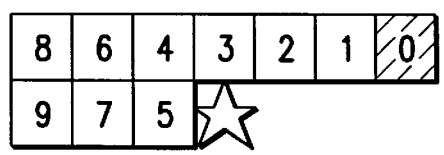 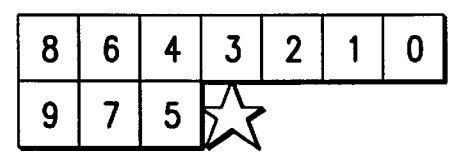
FIG. 3c       FIG. 3d

ARITHMETIC CODING CONTEXT MODEL THAT ADAPTS TO THE AMOUNT OF DATA

TECHNICAL FIELD

The present invention relates to a method and device for arithmetically encoding and, more particularly, to a arithmetic compressor/decompressor that adapts to the amount of data being processed.

BACKGROUND OF THE INVENTION

Data compression systems are known in the prior art that encode a stream of digital data signals into compressed digital code signals and decode the compressed digital code signals back into the original data. Data compression refers to any process that attempts to convert data in a given format into an alternative format requiring less space than the original. The objective of data compression systems is to effect a savings in the amount of storage required to hold or the amount of time required to transmit a given body of digital information.

To be of practical utility, a general purpose digital data compression system should satisfy certain criteria. The system should have reciprocity. In order for a data compression system to possess the property of reciprocity it must be possible to re-expand or decode the compressed data back into its original form without any alteration or loss of information. The decoded and original data must be identical and indistinguishable with respect to each other. The property of reciprocity is synonymous to that of strict noiselessness used in information theory. Some applications do not require strict adherence to the property of reciprocity. One such application in particular is when dealing with graphical data. Because the human eye is not that sensitive to noise, some alteration or loss of information during the compression de-compression process is acceptable.

The system should provide sufficient performance with respect to the data rates provided by and accepted by the devices with which the data compression and de-compression systems are communicating. The rate at which data can be compressed is determined by the input data processing rate into the compression system, typically in millions of bytes per second (megabytes/sec). Sufficient performance is necessary to maintain the data rates achieved in present day disk, tape and communication systems which rates typically exceed one megabyte/sec. Thus, the data compression and de-compression system must have enough data bandwidth so as to not adversely affect the overall system. The performance of data compression and de-compression systems is typically limited by the computations necessary to compress and de-compress and the speed of the system components such as, random access memory (RAM), and the like, utilized to store statistical data and guide the compression and de-compression process. Performance for a compression device is characterized by the number of processor cycles required per input character under the compressor. The fewer the number of cycles, the higher the performance.

Another important criteria in the design of data compression and de-compression systems is compression effectiveness, which is characterized by the compression ratio. The compression ratio is the ratio of data size in uncompressed form divided by the size in compressed form. In order for data to be compressible, the data must contain redundancy. Compression effectiveness is determined by how effectively the compression procedure uses the redundancy in the input data. In typical computer stored data, redundancy occurs both in the nonuniform usage of individual symbology, example digits, bytes, or characters, and in frequent recurrence of symbol sequences, such as common words, blank record fields and the like.

General purpose data compression procedures are also known in the prior art, three relevant procedures being the Huffman method, the Tunstall method and the Lempel-Ziv method. The Huffman method is widely known and used, reference thereto in article of D. A. Huffman entitled "A Method For Construction Of Minimum Redundancy Codes", Proceedings IRE, 40, 10 pages 1098–1100 (Sep. 1952). Reference to the Tunstall algorithm may be found in Doctoral thesis of B. P. Tunstall entitled "Synthesis of Noiseless Compression Codes", Georgia Institute of Technology (Sept. 1967). Reference may be had to the Lempel-Ziv procedure in a paper authored by J. Ziv and A. Lempel entitled "A Universal Algorithm For Sequential Data Compression", IEEE Transactions on Information Theory, IT-23, 3, pages 337–343 (May, 1977).

One of the first general purpose data compression procedures developed is the Huffman method. Briefly described, the Huffman procedure maps full length segments of symbols into variable length words. The Huffman data compression procedure suffers from two limitations. Firstly, the Huffman procedure operates under the constraint that the input data to be compressed be parsed into fixed length segments of symbols. Although the Huffman procedure provides the best compression ratio that can be obtained under these constraints, when the constraint is relaxed it is possible to obtain significantly better compression ratios by utilizing other procedures. Secondly, Huffman coding requires full knowledge of the statistical characteristic of the source data. The Huffman procedure operates under the assumption that the probability with which each fixed length input segment occurs is known. This requirement of the Huffman procedure can in practice, be satisfied by the use of an adaptive version of the procedure which accumulates the necessary statistics during processing of the data. This, however, is cumbersome, and requires considerable working memory space and performs sub-optimally during adaptation.

The Tunstall algorithm, which maps variable length segments of symbols into fixed length binary words, is complimentary to the Huffman procedure with the fixed length constraints now applied to the output segments instead of the input segments. Like the Huffman procedure, the Tunstall procedure requires a foreknowledge of the source data probabilities. Again this foreknowledge requirement can be satisfied to some degree by utilizing an adaptive version which accumulates the statistics during processing of the data.

The Lempel-Ziv procedure maps variable length segments of the symbols into variable length binary words. It is asymptotically optimal when there are no constraints on the input or output segments. In this procedure the input data string is parsed into adaptively grown segments, each segment consisting of an exact copy of an earlier portion of the input string suffixed by one new symbol from the input data. The copy which is to be made is the longest possible and is not constrained to coincide with any earlier parsed segment. The code word which replaces the segment in the output contains information consisting of a pointer to where the earlier copied portion begins, the length of the copy, and the new symbol.

It would appear that Huffman or Shannon-Fano coding is the perfect means of compressing data. However, this is not the case. As mentioned above, these coding methods are optimal when and only when the symbol probabilities are integral powers of ½, which is usually not the case.

The technique of arithmetic coding does not have this restriction: It achieves the same effect as treating the message as one single unit (a technique which would, for Huffman coding, require enumeration of every single possible message), and thus attains the theoretical entropy bound to compression efficiency for any source.

In arithmetic coding, one decision after another is encoded to define successively smaller, lesser included intervals along a number line. Additional information on arithmetic coding can be found in "An Introduction To Arithmetic Encoding"; by G. G. Langdon, Jr., IBM Journal of Research and Development, Vol. 28, n. 2, Mar. 1984, 135–149; and "Arithmetic Compression Code Control Parameters Approximation"; by D. R. Helman, G. G. Langdon, Jr., and J. J. Rissanen, Vol. 23, n. 11, Apr. 1981, 5112–5114 and U.S. Pat. No. 4,905,297, "Arithmetic Coding Encoder And Decoder System", Langdon, Jr. et al. all incorporated herein by reference.

As noted in the above articles, arithmetic coding provides that each decision has a plurality of possible exclusive outcomes "or events". Each outcome or event is represented in data by a symbol. In the imaging environment, for example, each decision may correspond to whether or not a given pixel is black. The decision outcome being represented by a Y (or YES) symbol if the pixel is black or an N (or NO) symbol if the pixel is not black. Thus, a plurality of decisions may then be represented by a sequence of symbols, e.g., YNNY . . .

In accordance with prior arithmetic coding teachings, a probability line has a current interval defined thereon. The first current interval is 0 to 1. The current interval is divided into segments in which segment corresponds to one possible outcome for the next decision. Where there are only two possible outcomes for each decision, the current interval is divided into two segments. The length of each segment is based on its respective associated probability. The respective probabilities may remain fixed or may adapt as decision data is entered.

It is the correlating of large segments to symbols which occur with greater frequency that leads to the compression effect. In the former cited article ("An Introduction To Arithmetic Encoding"), a 4-symbol arithmetic coding example is set forth in which each decision can result in an "a" event (having a 50% probability), a "b" event (having a 25% probability), a "c" event (having a 12.5% probability), or a "d" event (having a 12.5% probability). Representing the four events in binary form would require two bits for each decision, where the events would be represented respectively by 00, 01, 10, 11. For three decisions such as "aab" which is highly likely, the straight forward encoding data would be 00 00 01; requiring six bits. However, as observed in the article at page 137, the arithmetic coding approach permits the sequence "aab" to be represented by the value 0.001. Instead of six bits, the information can be represented in three bits. This conservation of bits results as successive events having relatively high associated probabilities occur.

The conservation deteriorates if numerous events occur for which there are low probabilities and relatively short line segments. With the above noted probabilities, a sequence of events "dd" would be represented with encoded data as 1111 whereas, by arithmetic coding, the "dd" events would be represented by 111111. Provided that the larger segments in fact correspond to events that occur with correspondingly greater frequency, the additional bits needed for less probable symbols are outweighed by the conservation achieved when more probable symbols occur.

Arithmetic coding adapts to data throughout the entire compression run and never forgets the past. This is counter to many LZ based schemes which are constantly losing the contents of their dictionaries. LZ rebuilds the dictionary, thus adapting to the next section of data. For LZ schemes, a 1 KB of data compresses just as well as a 100 KB of data. Arithmetic coding continues to improve it's probabilities throughout the run, which means that it will not do as well on 1 KB of data because it has not had the chance to optimize its adaptations. However, arithmetic coding compresses the 1 KB better than LZ.

Arithmetic coding uses a probability table to store statistics on the image. As each bit is compressed, the table is accessed to determine how the bit should be handled. The larger the table, the slower it moves to a final/optimal state. The larger the table, however, the better the compression ratios for larger images because more information is available for each bit. Simple experiments have shown the break point for benefiting from a larger table to be around 10 KB—after that point, larger tables yield a significantly better compression ratio.

In the operation of the printers, several different types of images are created. Some images are 100 KB to 200 KB in size, other images may be as small as 400 B or even smaller. A major contributor these small images is a font cache. Each unique character is first created and stored in the font cache before printing begins. Depending on the page, the amount of space used by the font cache may be an issue for successful rendering of the page.

Font usage becomes more critical if the same printer is used in a LAN environment. Several different users can send print jobs with their own preference for fonts and point sizes. With each new job, the printer determines if the requested character set already resides in the font cache from previous jobs. If it does not exist, then the time is taken to render the character. As the printer's memory is populated with font cache characters, there comes a point where those characters not immediately in demand must be removed from the font cache to make room for the other characters. Thus, the longer font cache characters stay around—especially across several jobs—the faster users receive their printouts. It is not uncommon for the wait for the font cache creation to be a noticeable amount of time. This is most often noticed when printing the first page after a power-on.

SUMMARY OF THE INVENTION

The present invention is accomplished by a method for compressing an original data into a compressed data. First, the size of the original data is determined. Based on the size, a context model is selected. The original data is compressed into the compressed data using the context model. Any number of context models may be defined and appropriate selection values chosen.

To decompress, it is necessary to select a context model based on a size of the original data. Two ways of detecting the correct context model are described. A first context model is selected if the size of the original data is less than a predefined amount, where the size of the original data is part of the compressed data. A second context model is selected if the size is more than the predefined amount. Alternatively, an indicator is retrieved from the compressed data. The indicator identifies which context model was used to compress the original data.

There is also provided an apparatus for compressing, or decompressing data, the apparatus is made from an arithmetic compressor, where the arithmetic compressor includes a probability table, a first context model, and a second context model. There is a shift register connected to the arithmetic compressor. The shift register receives the data. A controller is connected to the arithmetic compressor. The controller signals the arithmetic compressor to use the first context model to compress the data when the size of the data is less than a predefined amount, in the alternative, the arithmetic compressor uses the second context model to compress the data.

BRIEF DESCRIPTION OF THE DRAWINGS

A better understanding of the invention may be had from the consideration of the following detailed description taken in conjunction with the accompanying drawings in which:

FIG. 2 graphically represent the growing size of the probability table used.

FIG. 3 shows how a given context model can be used to adjust the sized of the probability table used.

DETAILED DESCRIPTION OF THE PREFERRED EMBODIMENTS

Figure 1:
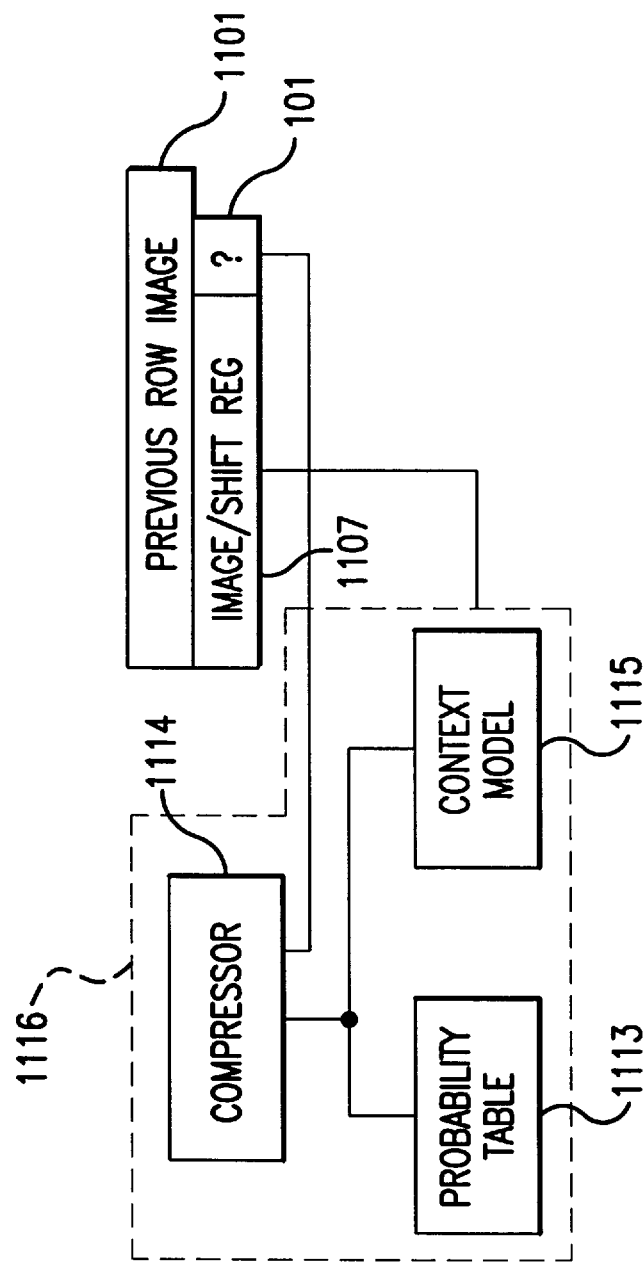
FIG. 1 is a block diagram of an arithmetic compressor.

The present invention is not limited to a specific embodiment illustrated herein. Referring to FIG. 1 a block diagram of a hardware implementation of the preferred embodiment of the present invention is shown. As arithmetic compressor 1116 attempts to compress bit 101, data from image/shift register 1107 is passed to context model 1115. The context model 1115 maps the data from the image/shift register 1107 into the probability table 1113. The compressor, along with the probability table 1113 and context model 1115 compresses bit 101. The compressed data is then written out, generally to a memory device not shown. Bit 101 is shifted into the image/shift register 1107 and a new bit from the image is shifted into 101.

Decompression is performed in generally the same manor as compression. However, during decompression, the arithmetic compressor reads in the compressed data, using the probability table 1113 and context model 1115 decompresses and stores bit 101. As before, once bit 101 is decompressed the data in image/shift register 1107 is shifted left. Data exiting image/shift register 1107 is stored, generally, in a memory device.

The compressor 1114 uses the probability table 1113 to store statistics on the image as it is compressed or decompressed. As each bit is compressed/decompressed, the probability table 1113 is accessed to determine how the bit should be handled. The larger the probability table 1113, the slower the final/optimal state is reached. However, the larger the probability table 1113 the better the compression ratios will be for larger images because more information is available for each bit.

Context model 1115 develops the index into probability table 1113 by looking at bits of data surrounding the bit being compressed. The important aspect to the indexing is that the addressed location contains useful information concerning the value of the bit to be encoded/decoded. More specifically, the bits used to index the probability table should be able to provide significant information so that a reliable prediction of the bit to be encoded/decoded can be made. The more reliable the prediction, the better the compressibility of the image.

The preferred embodiment of the present invention selects a context model optimized for the size of the data set being processed. Referring to FIG. 3, the two dimensional context model 300 expands for larger data sets. Each pixel is connected to an address line of the probability table. The numbers on the pixels indicate which particular address bit is controlled by that pixel. Referring to FIG. 3a, for data sets of less than 100 bytes, address bits 9, 8, 7, 6, 1 and 0 are forced to zero, which effectively reduces the size of the probability table as shown in FIG. 2a. Data sets between 100 bytes and 1K bytes of data, address bits 9, 8 and 0 are forced to zero as shown in FIG. 3b, effectively reducing the size of the probability table as shown in FIG. 2b. For data sets between 1K and 4K bytes of data, address bit 0 is forced to zero as shown in FIG. 3c, effectively reducing the size of the probability table as shown in FIG. 2c. The context model of FIG. 3d, and the entire probability table as shown in FIG. 2d, is then used to compress larger data sets.

Figure 5:
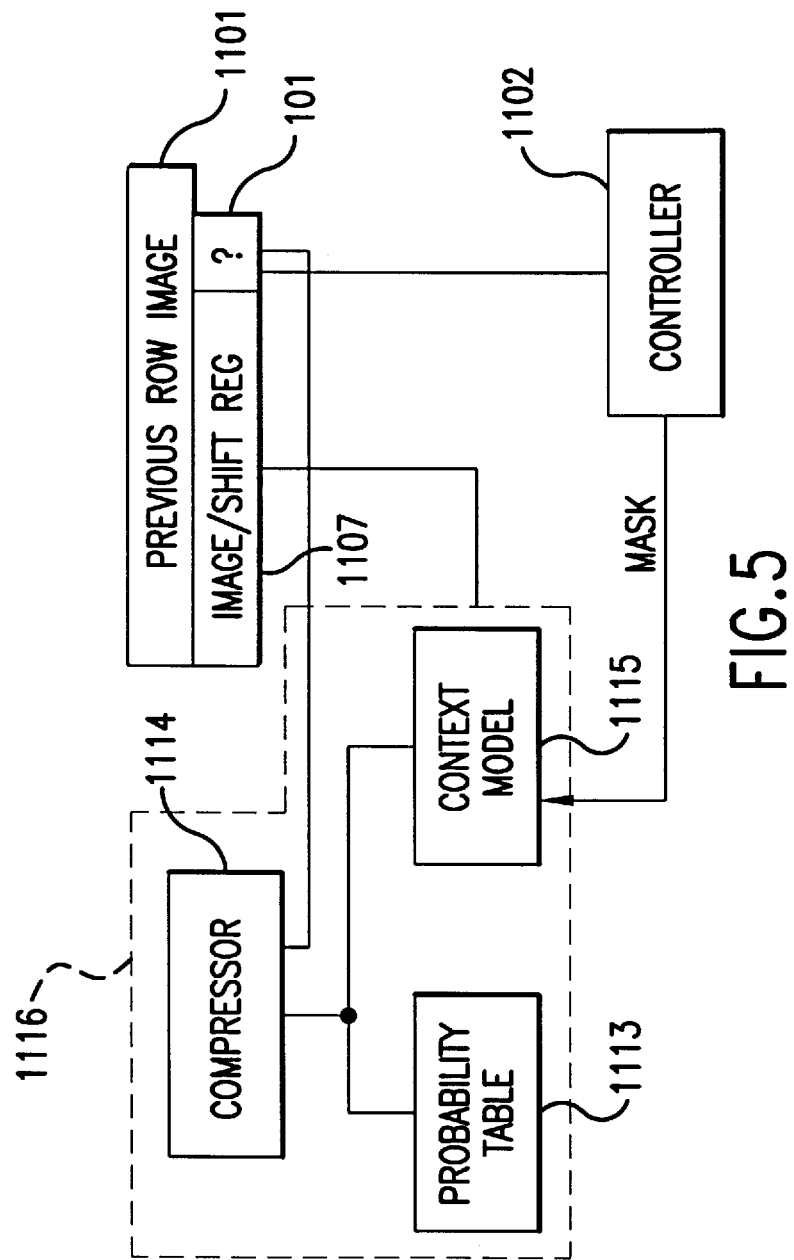
FIG. 5 is a block diagram of an arithmetic compressor in accordance with the present invention.

The block diagram of FIG. 1 can be modified to accomplish the present invention by the addition of a controller 1102. As shown in FIG. 5, one of controller 1102 tasks is to determine the number of bits to be processed. The output of controller 1102 signals the context model 1115 which bits to mask. Controller 1102 may have several other tasks not shown.

Figure 4:
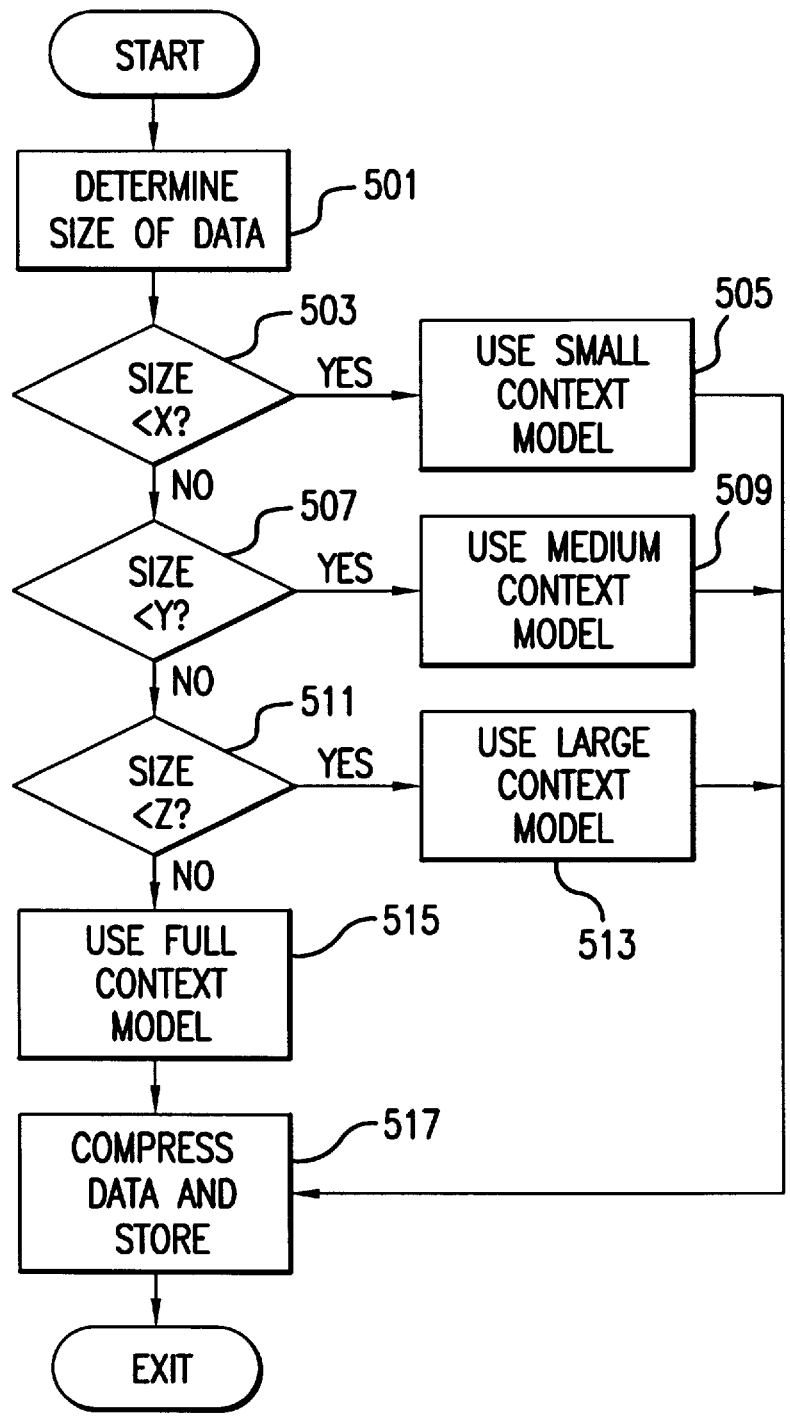
FIG. 4 is a flow diagram showing the logical operation of the preferred embodiment.

A flowchart of the preferred embodiment is shown in FIG. 4. Prior to compressing the data, the size of the data is determined 503. If size is less than X 503, then the small context model 507 is selected; if the size is greater than X and less than Y 507, then the medium context model 509 is selected; if the size is greater than Y and less than Z 511, then the large context model 513 is selected; and if the size is greater than Z, then the full context model 515 is selected. Once the context model is selected, the entire data is compressed 517 using the selected context model. One skilled in the art will understand that the order of operations given here may be varied while still implementing the underlying idea. Also, while the above describes small, medium, large and full context models, any number of context models may be defined and appropriate values for X, Y, Z, . . . chosen.

The flow chart of FIG. 4 can be used to decompress the data as well. However, the size of the uncompressed data is not directly related to the size of the compressed data. Therefore, some means of telling the decompressor the original size of the file or which context model was used to compress the data must be included with the compressed data. In the preferred embodiment, the height and width of the original image are stored as part of the compressed data. Other embodiments might store the uncompressed file size or a flag indicating which context model to use. Once the proper context model is elected, the data is decompressed.

The present invention provides improved compression ratios for font cache data (i.e., small files) with no impact of the compression ratio of larger images. In the particular case for Latin characters, the compression of font cache characters improved by 40%. That is to say that 40% more compressed characters will fit in the font cache as compared to the traditional arithmetic coding compression techniques. The complexity for masking the address bits is very small with only a noticeable amount of logic added to the design.

Although the preferred embodiment of the invention has been illustrated, and that form described, it is readily apparent to those skilled in the art that various modifications may be made therein without departing from the spirit of the invention or from the scope of the appended claims.

What is claimed is:

1. A method for compressing an original data into a compressed data, said method comprising the steps of:

determining a size of said original data, where said size is proportional to a total number of bits in said original data;

selecting a context model based on said size; and compressing said original data into said compressed data using said context model.

2. The method as claimed in 1 wherein said step of selecting a first context model if said size is less than a predefined amount and selecting a second context model if said size is more than said predefined amount.

3. The method as claimed in 1, further comprising the step of storing the compressed data.

4. A method for decompressing a compressed data into an original data, said method comprising the steps of:

selecting a context model based on a size of said original data, where said size is proportional to a total number of bits in said original data; and decompressing said compressed data into said original data using said context model.

5. The method as claimed in 4 wherein said step of selecting a first context model if said size is less than a predefined amount and selecting a second context model if said size is more than said predefined amount.

6. The method as claimed in 4 wherein said step of selecting a first context model if said compressed data indicates that said first context model was used to compress said compressed data and selecting a second context model if said compressed data indicates that said second context model was used to compress said compressed data.

7. The method as claimed in 4 wherein said step of selecting further comprising the steps of:

retrieving an indicator from said compressed data; and using said indicator to identify which context model to select.

8. An apparatus for compressing a data, said apparatus comprising:

an arithmetic compressor, said arithmetic compressor comprising:

a probability table;

a first context model; and a second context model;

a shift register connected to said arithmetic compressor, said shift register arranged to receive said data;

a means for determining a size of said data, where said size is proportional to a total number of bits in said original data, said means for determining connected to said arithmetic compressor, said means for determining signaling said arithmetic compressor to use said first context model to compress said data when said size of said data is less than predefined amount, in the alternative, said arithmetic compressor using said second context model to compress said data.

9. The apparatus as claimed in 8 wherein:

said first context model being optimized for an amount of data that is less than said predefined amount; and said second context model being optimized for an amount of data that is more than said predefined amount.

* * * * *